US006812791B2

(12) United States Patent
Strickland

(10) Patent No.: US 6,812,791 B2
(45) Date of Patent: Nov. 2, 2004

(54) METHOD AND SYSTEM FOR LINEARIZING AN AMPLIFIED SIGNAL

(75) Inventor: Lawrence P. Strickland, St. Petersburg, FL (US)

(73) Assignee: Raytheon Company, Waltham, MA (US)

( * ) Notice: Subject to any disclaimer, the term of this patent is extended or adjusted under 35 U.S.C. 154(b) by 53 days.

(21) Appl. No.: 10/270,840

(22) Filed: Oct. 14, 2002

(65) Prior Publication Data

US 2004/0070448 A1 Apr. 15, 2004

(51) Int. Cl.[7] .................................................. H03F 1/26
(52) U.S. Cl. ...................... 330/149; 330/136; 330/151
(58) Field of Search ................................. 330/136, 149, 330/151

(56) References Cited

U.S. PATENT DOCUMENTS

| | | |
|---|---|---|
| 1,686,792 A | 10/1928 | Black |
| 5,949,283 A * | 9/1999 | Proctor et al. ............. 330/149 |
| 2002/0048326 A1 | 4/2002 | Sahlman ..................... 375/297 |

FOREIGN PATENT DOCUMENTS

EP    1 124 324 A1    8/2001

OTHER PUBLICATIONS

"Improved Performance of MCPAs Using Adaptive Linearization Technology," *Powerwave Technologies,* 1999, 7 pages.
S. C. Cripps, "RF Power Amplifiers for Wireless Communications," *Artech House, Texas A&M University,* 1999, 33 pages.

* cited by examiner

*Primary Examiner*—Steven J. Mottola
(74) *Attorney, Agent, or Firm*—Baker Botts L.L.P.

(57) ABSTRACT

A method of processing an input signal to produce a corrected output signal includes generating a pre-distorted signal by distorting a digital input signal, the distortion based upon characteristics of a main amplifier, and correcting an output signal of the main amplifier to produce the corrected output signal. The output signal of the main amplifier is generated by amplifying the pre-distorted signal with the main amplifier. The correcting is based on a comparison of a signal indicative of the main amplifier output signal and a signal indicative of the digital input signal.

26 Claims, 2 Drawing Sheets

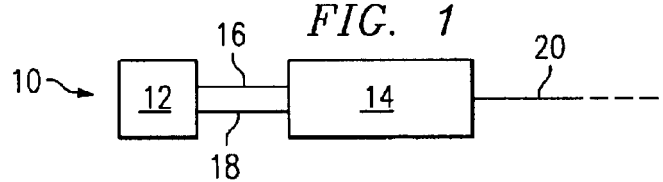
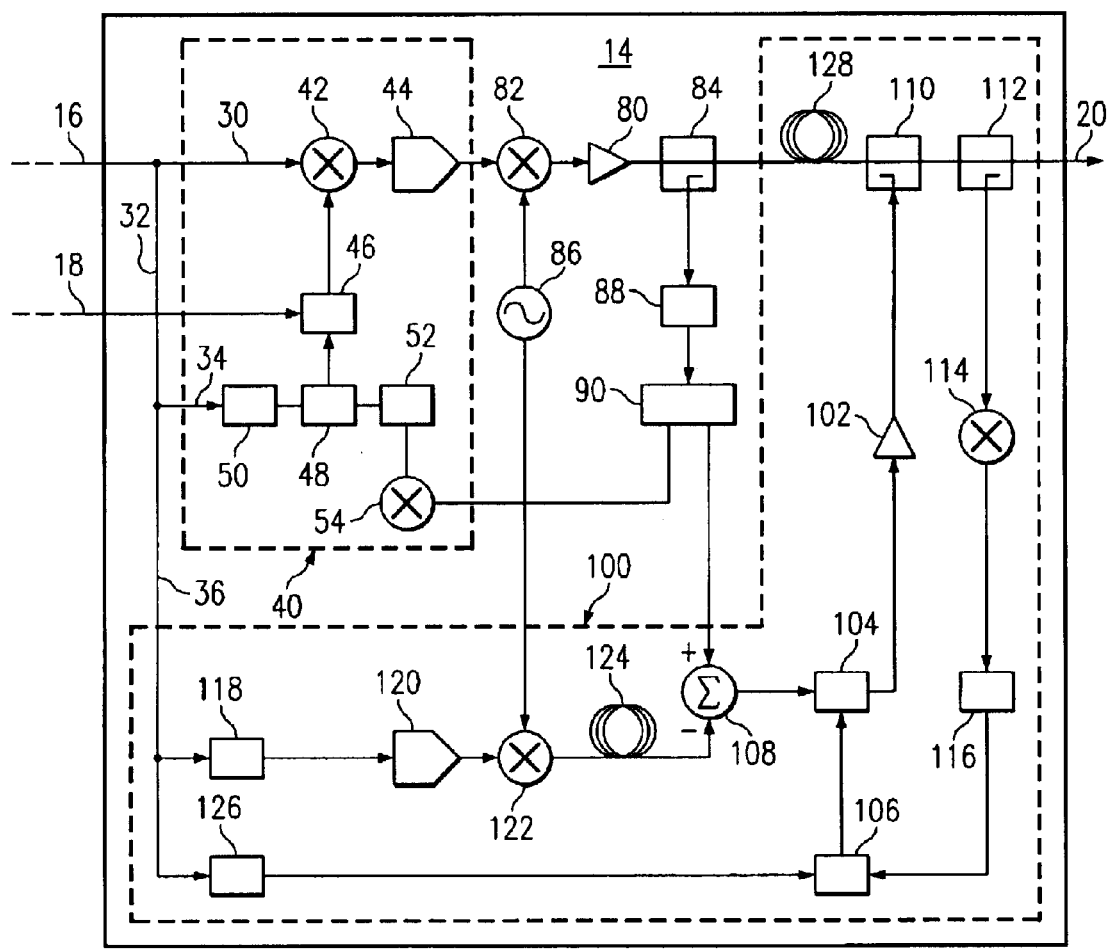

METHOD AND SYSTEM FOR LINEARIZING AN AMPLIFIED SIGNAL

TECHNICAL FIELD OF THE INVENTION

This invention relates in general to power amplifiers, and more particularly to a method and system for linearizing an amplified signal.

BACKGROUND OF THE INVENTION

Power amplifier technologies are well known. However, power amplification of a signal can lead to undesirable distortion of the signal. Therefore, various method have been developed for correcting, or "linearizing," the amplified signal. Linearizing is a process whereby nonlinear distortion of the signal caused by the amplifier is reduced. Specifically, an amplifier can introduce energy at unwanted frequencies in addition to increasing power of the desired frequencies. Through linearizing, the power level of the unwanted frequencies may be reduced.

Two common methods of linearizing are pre-distortion processing and feed-forward processing. Pre-distortion involves processing an input signal through a pre-distorter which, before amplification, adds distortion to the input signal corresponding to the distortion frequencies introduced by the main amplifier, but in the opposite phase. As the pre-distorted signal is then amplified by the main amplifier, the distortion components are at least partially cancelled out and the linear components remain. Pre-distortion processing is described in, for example, S. C. Cripps, *RF Power Amplifiers for Wireless Communications*, Boston: Artech House (1999).

Feed-forward processing was described in U.S. Pat. No. 1,686,792 issued to H. S. Black, and typically involves taking a sample of the main amplifier output, reducing the power of the amplifier output sample to the same level as the amplifier input, and then subtracting a sample of the amplifier input from the amplifier output sample, leaving a sample comprising an inverse (opposite phase) of the distortion generated by the amplifier. The inverse distortion sample is then amplified with a separate amplifier and fed into the main amplifier output, resulting in at least a partially linearized signal.

In some applications, current methods do not result in optimum levels of linearizing.

SUMMARY OF THE INVENTION

In accordance with one embodiment of the present invention, a method of processing an input signal to produce a corrected output signal includes generating a pre-distorted signal by distorting a digital input signal, the distortion based upon characteristics of a main amplifier, and correcting an output signal of the main amplifier to produce the corrected output signal. The output signal of the main amplifier is generated by amplifying the pre-distorted signal with the main amplifier. The correcting is based on a comparison of a signal indicative of the main amplifier output signal and a signal indicative of the digital input signal.

A technical advantage of certain embodiments of the present invention include increased overall linearizing. By effectively combining pre-distortion and feed-forward correction processes, the power of unwanted frequencies introduced by power amplification may in accordance with certain embodiments of the present invention be reduced by an amount greater than about 45 dB.

Certain embodiments may possess none, one, some, or all of these technical features and advantages and/or additional technical features and advantages. Other technical advantages will be readily apparent to one skilled in the art from the following figures, description, and claims.

BRIEF DESCRIPTION OF THE DRAWINGS

For a more complete understanding of the present invention and its advantages, reference is now made to the following description, taken in conjunction with the accompanying drawings, in which:

FIG. 1 is a block diagram illustrating a power amplification system in accordance with one embodiment of the present invention;

FIG. 2 is a block diagram illustrating an amplification module of the system of FIG. 1 in accordance with one embodiment of the present invention.

DETAILED DESCRIPTION OF THE INVENTION

Figure 3:
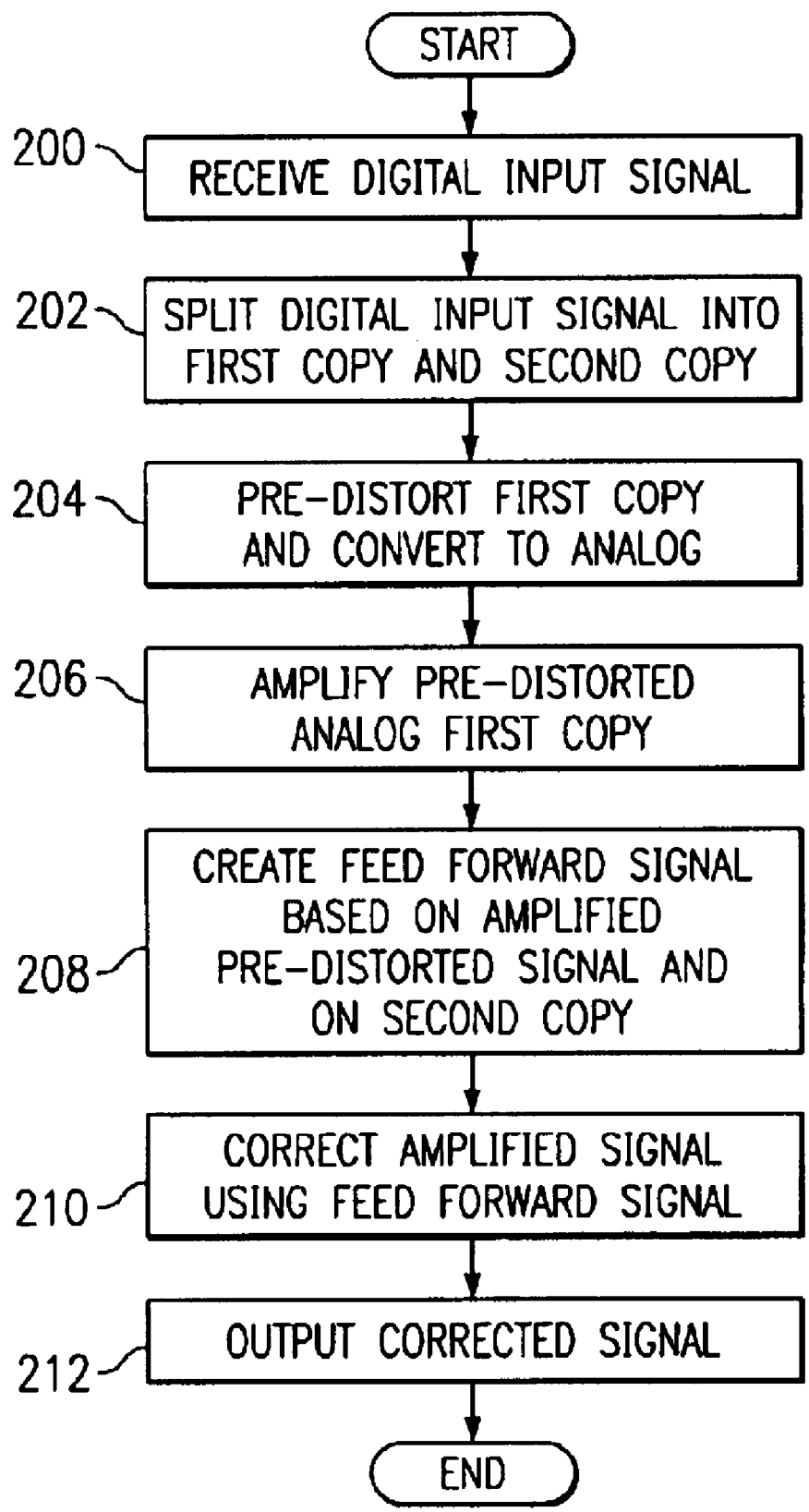
FIG. 3 is a flowchart illustrating a method of linearizing of an amplified signal in accordance with one embodiment of the present invention.

FIG. 1 is a block diagram illustrating a power amplification system in accordance with one embodiment of the present invention. The power amplification system of FIG. 1 allows for simultaneously combining feed-forward and pre-distortion linearizing techniques for power amplification.

Referring to FIG. 1, the system 10 comprises a signal generator 12, leads 16 and 18, an amplification module 14, and an egress lead 20. In the illustrated embodiment, signal generator 12 comprises a digital signal generator that is operable to produce and output to lead 16 complex signal vectors corresponding to a desired system output waveform. In addition, signal generator 12 may output scalar envelope values of the complex signal vectors to lead 18.

Amplification module 14 receives a digital input from signal generator 12 via leads 16 and 18. Amplification module 14 converts the signal vectors to an analog signal, amplifies the analog signal, and also applies pre-distortion and feed-forward linearizing techniques, as described in further detail below in reference to FIG. 2. Amplification module 14 outputs the amplified and linearized signal to egress lead 20. According to the teachings of the invention, the two linearity improvement processes—pre-distortion and feed-forward—may be simultaneously operated in amplification module 14 without undesirable interaction between the two. The teachings of the invention recognize that combining the two processes together to linearize the same inputted signal may result in the processes "fighting" each other and thus reducing or eliminating the effectiveness of the linearizing techniques and/or introducing additional distortion. Specifically, in a typical feed-forward process, a sample of the input to the main amplifier provides drive to the feed-forward process. Any pre-distortion from a pre-distortion linearizing process in the input sample, however, might be processed by the feed-forward system and the feed-forward system would attempt to preserve the pre-distortion products.

The teachings of the invention address this problem. In some embodiments, as described further below in reference to FIG. 2, the sampling points, references, and circuit adjustments of the pre-distortion and feed-forward correction techniques are separated, and thus the corresponding correction algorithms can operate simultaneously and without interaction between the two. Updates to a pre-distortion look-up table do not affect the amount of correction provided by the feed-forward process and updates to the feed-forward circuit adjustments do not affect the amount of correction provided by the pre-distortion process. By effectively combining pre-distortion and feed-forward correction processes, the power of unwanted frequencies introduced by power amplification may in accordance with certain embodiments of the present invention be reduced by an amount greater than about 45 dB.

FIG. 2 is a block diagram illustrating amplification module 14 of the system of FIG. 1 in accordance with one embodiment of the present invention. Amplification module 14, as described below, is operable to correct or linearize the output of a main amplifier by the simultaneous operation of both pre-distortion processing and feed-forward processing. It will be understood that "simultaneous" as used in the present invention means that the two processes may be operating at the same time within amplification module 14 to linearize a signal from the same source and thus increasing the overall linearizing of the signal. It will be understood that simultaneous operation would include the signal being linearized first by the pre-distortion system and then by the feed-forward system as the signal passes through the amplification module 14.

Referring to FIG. 2, amplification module 14 comprises pre-distortion system 40, main amplifier 80, and feed-forward system 100. Pre-distortion system 40 generates a pre-distorted signal by distorting the input signal, the distortion based upon characteristics of a main amplifier. Feed-forward system 100 corrects an output signal of the main amplifier 80 to produce the corrected output signal, the output signal of the main amplifier generated by amplifying the pre-distorted signal with the main amplifier 80. The correcting performed by feed-forward system 100 is based on a comparison of a signal indicative of the main amplifier output signal and a signal indicative of the undistorted input signal.

In operation, complex signal vectors from signal generator 12 carried by lead 16 are split into two copies, represented by lead 30 and lead 32. The copies of the signal vectors from signal generator 12 carried by leads 30 and 32 may or may not be identical in power and/or energy. The signal vectors carried by lead 32 are further split and carried by leads 34 and 36. Leads 30 and 34 provide digital signal input to pre-distortion system 40 and lead 36 provides digital signal input to feed-forward system 100. Pre-distortion system 40 also receives input of scalar envelope values of the signal generator via lead 18.

Pre-distortion system 40 is operable to partially correct or linearize the output of main amplifier 80 by generating a pre-distorted signal by distorting the input signal vectors carried on lead 30 based upon distortion characteristics of the main amplifier. In the illustrated embodiment, the pre-distortion system 40, as described in further detail below, utilizes the actual output of the amplifier 80 to conduct pre-distortion adaptive processing. It will be understood that pre-distortion system 40 may utilize other inputs and/or use pre-determined characteristics of main amplifier 80 to pre-distort the signal to main amplifier 80.

Pre-distortion system 40 comprises, in this embodiment, a complex multiplier 42, a digital-to-analog converter (DAC) 44, a lookup table 46, a pre-distortion adaptive processing module 48, a delay module 50, an analog-to-digital converter (ADC) 52, and a down-converter 54.

Complex multiplier 42 is operable to adjust the gain and phase values of the complex signal vectors by indexed complex gain vectors and to output the resulting pre-distorted digital signal to DAC 44. As described in further detail below, the complex gain vectors used by the complex multiplier 42 are based upon pre-distortion adaptive processing using a signal sample from main amplifier 80. Look-up table 46 stores the complex gain vectors that are indexed by the scalar envelope values received from the signal generator via line 18. DAC 44 outputs the pre-distorted analog drive signal to up-converter 82, which translates the DAC 44 output frequency to the final frequency of the system. The frequency-translated output of DAC 44 is received by the main amplifier 80. The distortion of the pre-distortion signal corresponds to the distortion caused by the amplifier but is in the opposite phase as the distortion of the amplifier; in this way, the distortion caused by the amplifier is reduced by the pre-distortion system.

A coupler 84, an attenuator 88, and a splitter 90 provide samples of the main amplifier output to pre-distortion system 40 and feed-forward system 100. A first of the two outputs from splitter 90 is received at pre-distortion system 40 at down-converter 54, which outputs a frequency-corrected signal to ADC 52. ADC 52 provides a complex digital representation of the main amplifier output to pre-distortion adaptive processing module 48. The pre-distortion adaptive processing module 48 compares the digital sample of the main amplifier output to a delayed version of the digital signal generator output from delay module 50 and updates the look-up table to minimize the difference between the two. The delay of module 50 output is set to match the delay of the digital sample of the main amplifier output.

Feed-forward system 100 is operable to correct or linearize the output of main amplifier 80 based upon a comparison of a signal indicative of the main amplifier output signal and a signal indicative of the undistorted input signal from the signal generator. As described in further detail below, in the illustrated embodiment, the signal indicative of the main amplifier output signal is received by the system 100 from the splitter 90, and the signal vectors indicative of the undistorted input signal from the signal generator are received by the system 100 from lead 36.

A sample of the undistorted signal generator output from lead 36 is delayed at delay module 118, converted to an analog signal by DAC 120, and converted to the final frequency (in conjunction with oscillator 86) by up-converter 122. The delay from delay module 118 is matched to the delay of the complex multiplier 42. The undistorted input waveform from up-converter 122 is provided to summing network 108 via delay module 124. The delay of delay module 124 matches the delay through main amplifier 80.

The summing network 108 subtracts the undistorted input waveform from delay module 124 from the second sample of the main amplifier output from splitter 90, leaving a sample of the distortion products not completely removed by the pre-distortion process. The sample of the remaining distortion products is gain and phase adjusted by gain and phase adjustment module 104, and then amplified by error amplifier 102. The gain and phase adjustments are set so that the distortion products in the error amplifier output are in opposite phase to those of the main amplifier output. The resulting error amplifier output is injected into the system output path by coupler 110 to further attenuate the distortion products remaining in the main amplifier output. The delay of delay module 128 in the system output path is matched to the delay through the error amplifier path.

In the illustrated embodiment, feed-forward adaptive processing allows for the refinement of the correction or linearizing of system 100. Coupler 112 provides a sample of the system output signal to ADC 116 via down-converter 114, and ADC 116 provides a complex digital representation of the system output to a feed-forward adaptive processing module 106. Feed-forward adaptive processing module 106 compares the digital sample of the system output to a delayed version of the digital signal generator output from delay module 126 and adjusts the gain and phase adjustment module 104 to minimize the difference between the two digital samples. The delay module 126 is set to match the delay of the digital sample of the output from ADC 116.

Because in this implementation, the sampling points, references, and circuit adjustments of the pre-distortion and feed-forward correction techniques are entirely separate, the corresponding correction algorithms can operate simultaneously and without interaction between the two. Updates to the pre-distortion look-up table will not affect the amount of correction provided by the feed-forward process and updates to the feed-forward circuit adjustments will not affect the amount of correction provided by the pre-distortion process.

FIG. 3 is a flowchart illustrating a method of linearizing of an amplified signal in accordance with one embodiment of the present invention. The method of FIG. 3 is described below with reference to the embodiment illustrated in FIG. 2.

Referring to FIG. 3, the method begins with step 200 wherein a complex digital input signal is received by the amplification module 14 from the signal generator 12. At step 202, the digital signal is split into a first copy and a second copy. The copies need not be identical in power and/or energy. On FIG. 2, the first copy is carried on lead 30, and the second copy on lead 36.

Proceeding to step 204, the first copy is pre-distorted by pre-distortion system 40 based upon the distortion characteristics of the main amplifier 80 of the amplification module 14. Pre-distortion system 40 outputs the analog version of the pre-distorted first copy of the digital signal, and, at step 206, the main amplifier 80 amplifies the pre-distorted output of pre-distortion system 40.

Proceeding to step 208, feed-forward system 100 creates a feed-forward signal based on characteristics of the pre-distorted first copy and of the undistorted second copy of the digital input signal. At step 210, the feed-forward system 100 corrects the amplified signal by combining the feed-forward signal with the output of the main amplifier 80. As described above, the feed-forward signal may also be based upon a sample of the output signal using feed-forward adaptive processing module 106. At step 212, the amplification module 14 outputs the amplified and linearized signal.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method of processing a digital input signal to produce a corrected output signal, comprising:
   generating a pre-distorted signal by distorting the digital input signal, the distortion based upon characteristics of a main amplifier; and
   correcting an output signal of the main amplifier to produce the corrected output signal, the output signal of the main amplifier generated by amplifying the pre-distorted signal with the main amplifier, the correcting based on a comparison of:
      a sample of a system output signal, the system output signal taken from a system output path after injection of a correction signal from an error amplifier output; and
      a signal indicative of the digital input signal.

2. The method of claim 1, wherein the characteristics of the main amplifier are determined based upon adaptive processing of the main amplifier output signal.

3. The method of claim 2, wherein the characteristics of the main amplifier are accessed from a database comprising a look-up table.

4. The method of claim 3, wherein the database is updated based upon the adaptive processing.

5. The method of claim 1, wherein distorting the digital input signal reduces non-linear distortion of the main amplifier output signal resulting from characteristics of the main amplifier.

6. The method of claim 1, wherein the correcting comprises reducing non-linear distortion of the main amplifier output signal resulting from characteristics of the main amplifier.

7. The method of claim 1, wherein:
   both the distorting and the correcting comprise reducing non-linear distortion of the main amplifier output signal resulting from characteristics of the main amplifier, resulting in a total reduction in non-linear distortion; and
   the total reduction is greater than about 45 dB.

8. The method of claim 1, wherein the correcting is further based upon adaptive processing of the corrected output signal.

9. A system for processing a digital input signal to produce a corrected output signal, comprising:
   a pre-distortion system operable to generate a pre-distorted signal by distorting the digital input signal, the distortion based upon characteristics of a main amplifier; and
   a feed-forward system operable to correct an output signal of the main amplifier to produce the corrected output signal, the main amplifier output signal generated by amplifying the pre-distorted signal with the main amplifier, the correction based on a comparison of:
      a sample of a system output signal, the system output signal taken from a system output path after injection of a correction signal from an error amplifier output; and
      a signal indicative of the digital input signal.

10. The system of claim 9, wherein the characteristics of the main amplifier are determined based upon adaptive processing of the main amplifier output signal.

11. The system of claim 10, wherein the characteristics of the main amplifier are accessed from a database comprising a look-up table.

12. The system of claim 11, wherein the database is updated based upon the adaptive processing.

13. The system of claim 9, wherein distorting the digital input signal reduces non-linear distortion of the main amplifier output signal resulting from characteristics of the main amplifier.

14. The system of claim 9, wherein the feed-forward system reduces non-linear distortion of the main amplifier output signal resulting from characteristics of the main amplifier.

15. The system of claim 9, wherein:
  both the pre-distortion system and the feed-forward system reduce non-linear distortion of the main amplifier output signal resulting from characteristics of the main amplifier, resulting in a total reduction in non-linear distortion; and
  the total reduction is greater than about 45 dB.

16. The system of claim 9, wherein the correction is further based upon adaptive processing of the corrected undistorted output signal.

17. A method of processing an input signal to produce a corrected output signal, comprising:
  determining characteristics of a main amplifier based upon adaptive processing of a main amplifier output signal;
  generating a pre-distorted signal by distorting the input signal, the distortion based upon the characteristics of the main amplifier; and
  correcting an output signal of the main amplifier to produce the corrected output signal, the output signal of the main amplifier generated by amplifying the pre-distorted signal with the main amplifier, the correcting based on a comparison of:
    a sample of a system output signal, the system output signal taken from a system output path after injection of a correction signal from an error amplifier output; and
    a signal indicative of the input signal.

18. The method of claim 17, wherein the correcting comprises reducing non-linear distortion of the main amplifier output signal resulting from characteristics of the main amplifier.

19. The method of claim 17, wherein:
  both the distorting and the correcting comprise reducing non-linear distortion of the main amplifier output signal resulting from characteristics of the main amplifier, resulting in a total reduction in non-linear distortion; and
  the total reduction is greater than about 45 dB.

20. The method of claim 17, wherein the correcting is further based upon adaptive processing of the corrected output signal.

21. The method of claim 1, wherein the correction signal from the error amplifier output is operable to attenuate any distortion products remaining in the output signal of the amplifier.

22. The system of claim 9, wherein the correction signal from the error amplifier output is operable to attenuate any distortion products remaining in the output signal of the amplifier.

23. The system of claim 9, wherein the feed-forward system comprises a coupler operable to:
  remove the sample of the system output signal from the output path; and
  forward the sample for feed-forward adaptive processing.

24. The system of claim 9, wherein the error amplifier output is injected into the system output path by a coupler.

25. The system of claim 22, wherein the coupler operates to attenuate the distortion remaining in the output signal of the amplifier.

26. The method of claim 17, wherein the correction signal from the error amplifier output is operable to attenuate any distortion products remaining in the output signal of the amplifier.

* * * * *

UNITED STATES PATENT AND TRADEMARK OFFICE
CERTIFICATE OF CORRECTION

PATENT NO. : 6,812,791 B2
DATED : November 2, 2004
INVENTOR(S) : Lawrence P. Strickland It is certified that error appears in the above-identified patent and that said Letters Patent is hereby corrected as shown below:

Column 5,
Line 49, after "upon a sample of the" insert -- system --.

Signed and Sealed this

Eleventh Day of October, 2005

JON W. DUDAS
*Director of the United States Patent and Trademark Office*